(12) United States Patent
Whalen et al.

(10) Patent No.: US 6,902,059 B2
(45) Date of Patent: Jun. 7, 2005

(54) DISK CARRIER

(75) Inventors: Thomas J. Whalen, Minnetrista, MN (US); Michael S. Adams, New Prague, MN (US); Garry Anderson, Chaska, MN (US)

(73) Assignee: Entegris, Inc., Chaska, MN (US)

( * ) Notice: Subject to any disclaimer, the term of this patent is extended or adjusted under 35 U.S.C. 154(b) by 46 days.

(21) Appl. No.: 10/208,719

(22) Filed: Jul. 30, 2002

(65) Prior Publication Data

US 2003/0029772 A1 Feb. 13, 2003

Related U.S. Application Data

(60) Provisional application No. 60/309,241, filed on Jul. 31, 2001.

(51) Int. Cl.[7] .......................... B65D 85/57; B65D 85/90
(52) U.S. Cl. .......................... 206/445; 53/471; 206/454; 206/711
(58) Field of Search .................. 53/467, 471; 206/307, 206/719, 303, 308.1, 309, 445, 454, 710–712, 832, 833; 211/41.18

(56) References Cited

U.S. PATENT DOCUMENTS

| 4,557,382 A | 12/1985 | Johnson |
|---|---|---|
| 4,679,689 A | 7/1987 | Blome |
| 4,721,207 A | 1/1988 | Kikuchi |
| 4,747,488 A * | 5/1988 | Kikuchi .................. 206/308.3 |
| 4,773,537 A * | 9/1988 | Kikuchi .................. 206/308.3 |
| 4,779,732 A | 10/1988 | Boehm et al. |
| 5,253,755 A | 10/1993 | Maenke |
| 5,850,921 A * | 12/1998 | Shindou et al. ............. 206/711 |
| 6,070,730 A | 6/2000 | Narisawa et al. |

* cited by examiner

Primary Examiner—Jim Foster
(74) Attorney, Agent, or Firm—Patterson, Thuente, Skaar & Christensen, P.A.

(57) ABSTRACT

The disk carrier is used to house and secure a plurality of disks and comprises a disk cassette having an open top, an open bottom, and end wall ingresses; a top cover; and a bottom cover. The top cover has flaps to cover the end wall ingresses. To reduce particulation from opening and closing the disk carrier, one embodiment of the disk carrier implements an articulation in the flaps. Another embodiment implements a living hinge on the bottom cover. The disk carrier also has a path to ground for dissipating static and other electrical charge away from the disks.

23 Claims, 15 Drawing Sheets

DISK CARRIER

RELATED APPLICATIONS

This application claims the benefit of U.S. Provisional Application No. 60/309,241, filed on Jul. 31, 2001, which is hereby incorporated herein by reference.

FIELD OF THE INVENTION

The present invention relates to a container configured to hold a particular article or set of articles or material. In particular, the present invention relates to a disk carrier or container used to house and protect computer components such as magnetic disks or wafer disks during a manufacturing or transportation process, wherein the disk carrier comprises a disk cassette, a top cover, and a bottom cover, the top cover having an articulation in one embodiment and the bottom cover having a living hinge in another embodiment.

BACKGROUND OF THE INVENTION

As precision and smaller tolerances become the expected norm in computational and processing machines, better equipment used to fabricate components is expected by manufacturers. To house and protect magnetic disks, wafer disks, or similar inventory during a manufacturing process, special carriers or containers, also known as boats, baskets, or cassettes are used. One kind of conventional container comprises a disk cassette having an open top and an open bottom, a top cover, and a bottom cover. Each is formed separately by injection molding. The disk cassette is integrally formed of a rigid plastic, such as polycarbonate, that may be conductive. It has elongate side walls that extend vertically on the upper portions and curve inwardly on the bottom portions to the open bottom, and vertical end walls with U-shaped contours defining a U-shaped opening. The top cover may be formed of polycarbonate, polypropylene, or many similar injection grade polymers. It is shaped to follow the contour of and continuously align with the top of the side walls and end walls, and typically snaps onto a catch at or rests on the lower end of the U-shaped contours in the end walls. The bottom cover may be formed of a similar polymer as the top cover and is generally rectangular and tray shaped. It is molded to engage and be frictionally retained by the open bottom of the disk cassette. Examples of this kind of container are found in U.S. Pat. No. 4,557,382 and U.S. Pat. No. 5,253,755. Another example is Narisawa et al., U.S. Pat. No. 6,070,730, Disk Container, which is hereby incorporated herein by reference.

Several other variations of this kind of container are disclosed in Kikuchi, U.S. Pat. No. 4,721,207, Hard Disk Container; Boehm et al., U.S. Pat. No. 4,779,732, Container for Plurality of Disk-Shaped Articles and Container Part Thereof; and Maenke, U.S. Pat. No. 5,253,755, Cushioned Cover for Disk Container. Each of these containers conforms to one or two common themes. First, the bottom covers are designed to engage and be frictionally retained by a bottom edge or perimeter of a disk cassette. Second, the top covers have flaps that come over the side walls of the disk cassette and attach to the side walls just below the U-shaped contours. In Boehm, one flap extends off the top cover and the other off the bottom cover. These flaps conceal an ingress such as the U-shaped contours or an orifice providing access to the disks through the end walls.

The means for attaching the flaps is often similar to the following: "The closure parts 3 and 4 have an approximately L-shaped cross-section . . . They are advantageously produced from an elastically deformable plastics material, in particular a thermoplastics material, so that the arm of the L-form or the wall 9 or 9' can be bent through a total distance sufficient for it to project beyond the projection 8 or 8'. Because of their springiness, the walls 9 and 9' snap over the projections 8 and 8' and lock the parts 1 and 2 together." (Quoting from U.S. Pat. No. 4,779,732.) This attachment means is a source or cause for increased particulation on the end disks housed in a disk carrier, which is undesirable in a clean room manufacturing process. As a consequence, manufactures often put "dummy" disks, disks that are not intended for use in a product, on each end of the disk carrier to shield the other disks. If these dummy disks were not needed, through put could be increased at a substantial cost savings to the manufacturer.

In addition to the above described problem, disk carriers do not have a complete path to ground for dissipating static or other electrical charge away from disks and thereby further protecting the disks against accidental arching and other unintended events. Often, only the disk cassette is conductive.

Therefore, it would be advantageous to have a disk carrier that could significantly reduce the particulation created by opening and closing a disk carrier and could efficiently and cost effectively dissipate undesirable electrical charge away from the disks and to a ground if one is available.

SUMMARY OF THE INVENTION

The disk carrier is used to house and secure a plurality of disks and comprises a disk cassette having an open top, an open bottom, and end wall ingresses; a top cover; and a bottom cover. The top cover has flaps to cover the end wall ingresses. To reduce particulation from opening and closing the disk carrier, one embodiment of the disk carrier implements an articulation in the flaps. Another embodiment implements a living hinge on the bottom cover. The disk carrier also has a path to ground for dissipating static and other electrical charge away from the disks.

The present invention provides a disk carrier with articulated flaps extending from the top cover or the bottom cover to conceal the U-shaped contours of or orifices in the end walls of a disk cassette. By appropriately positioning the articulation on the flaps, it is possible to conceal the ingresses without the "snap". In the alternative or in addition to implementing articulated flaps to reduce particulation, the top cover and bottom cover may attach to each other by first enveloping the disk cassette to conceal the end wall ingresses and then attaching to each other to trap the disk cassette between them. Finally, by using electrically conductive materials for the disk carrier, or strips of electrically conductive material that create an electrical path between the disks and the bottom surface of the disk carrier, a path to ground is created from the disks when the disk carrier is set on a grounded surface.

In early testing performed by an international computer manufacturer during the development of the present invention, a 25 disk capacity disk carrier assembly presently used by the manufacturer and a preferred embodiment of the present invention of equal capacity were each cleaned and loaded with disks and then latched and unlatched for 20 complete thermal cycles. The manufacturer then measured the particulation on the disks and found 95 particles on the disk in position 1 and 190 particles on the disk in position 25 of the existing disk carrier assembly, and only 4 particles on the disk in position 1 and 22 particles on the disk in position 25 of the present invention. Moreover, the 22 particles on the disk in position 25 of the present invention were actually one larger particle. These results are very desirable not only for end position disks but for any disk in a disk carrier.

A first embodiment of the disk carrier comprises a disk cassette, a top cover, and a bottom cover. The disk cassette has at least two opposing side walls and at least two opposing end walls forming an interior to enclose and house a plurality of disks therein, a top edge defining a top opening, and a bottom edge defining a bottom opening. The side walls have a plurality of disk confining ribs and a plurality of slot portions to secure the disks in the interior of the disk cassette. The end walls have at least one ingress to access the disks. The bottom cover has at least two bottom cover ends and is configured and arranged to attach to the bottom edge of the disk cassette to cover the bottom opening. Together, the side walls and the bottom cover ends define a side connecting region. The top cover is configured and arranged to attach to the top edge and cover the top opening and the at least one end wall ingress. The top cover has at least one flap to conceal the at least one end wall ingress. The at least one flap has an articulation defining a lower flap portion so the lower flap portion by itself may move outwardly to ride over a cooperating connection structure to connect the flap to the side connecting region, without "snapping" back but rather returning smoothly to its natural position when it is allowed to do so, the flap bending at the articulation.

A second embodiment of the disk carrier also comprises a disk cassette, a top cover, and a bottom cover. The disk cassette has at least two opposing side walls and at least two opposing end walls forming an interior to enclose and house a plurality of disks therein, a top edge defining a top opening, and a bottom edge having an inner perimeter and defining a bottom opening. The side walls have a plurality of disk confining ribs and a plurality of slot portions to secure the disks in the interior of the disk cassette. The end walls have at least one ingress to access the disks. The bottom cover has a bottom cover edge, at least two bottom cover ends, and a living hinge between the bottom cover ends to contract and expand the bottom cover. The bottom cover edge is configured and arranged to align against the inner perimeter so the bottom cover covers the bottom opening. The top cover is configured and arranged to attach to the top edge and cover the top opening and the at least one end wall ingress. The top cover has at least one flap to conceal the at least one end wall ingress, which flap extends to the bottom cover to connect therewith.

In operation, the first embodiment is used by providing a disk carrier including a disk cassette having an open top, an open bottom, and at least one end wall ingress; a top cover including at least one flap having an articulation defining a lower flap portion; a bottom cover; and at least one disk. The at least one disk is inserted into the disk cassette and the bottom cover is attached to the disk cassette. The top cover is attached to the disk cassette, causing the lower flap portion to ride over a connecting structure on the disk cassette or bottom cover to at least partially connect the flap to the disk cassette and bottom cover. The flap is then pushed inwardly to secure the connection. Those skilled in the art are aware that these steps may be performed as effectively in other orders as well.

In operation, the second embodiment is used by providing a disk carrier including a disk cassette having an open top, an open bottom, and at least one end wall ingress; a bottom cover having at least two bottom cover ends and a living hinge between the ends to contract and expand the bottom cover; a top cover including at least one flap extending to the bottom cover to connect therewith; and at least one disk. The disk is inserted into the disk cassette and the top cover is attached to the disk cassette. The bottom is contracted, at least partially inserted into the bottom opening, and then expanded to connect the bottom cover and the top cover. Those skilled in the art are aware that these steps may be performed as effectively in other orders as well.

DESCRIPTION OF THE PREFERRED EMBODIMENT

Figure 1:
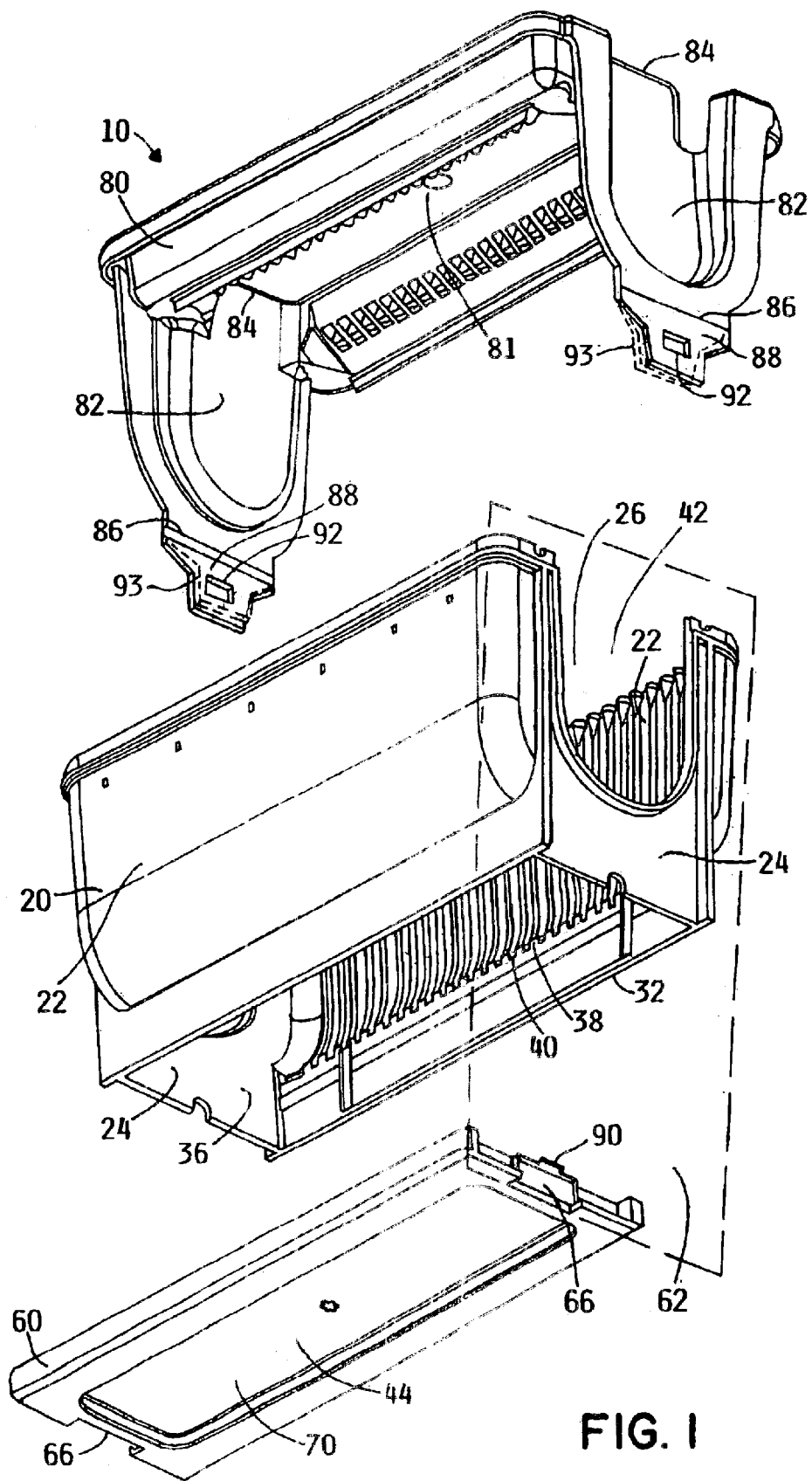
FIG. 1 is an exploded view of the first embodiment of a disk carrier in accordance with the present invention.
Figure 2:
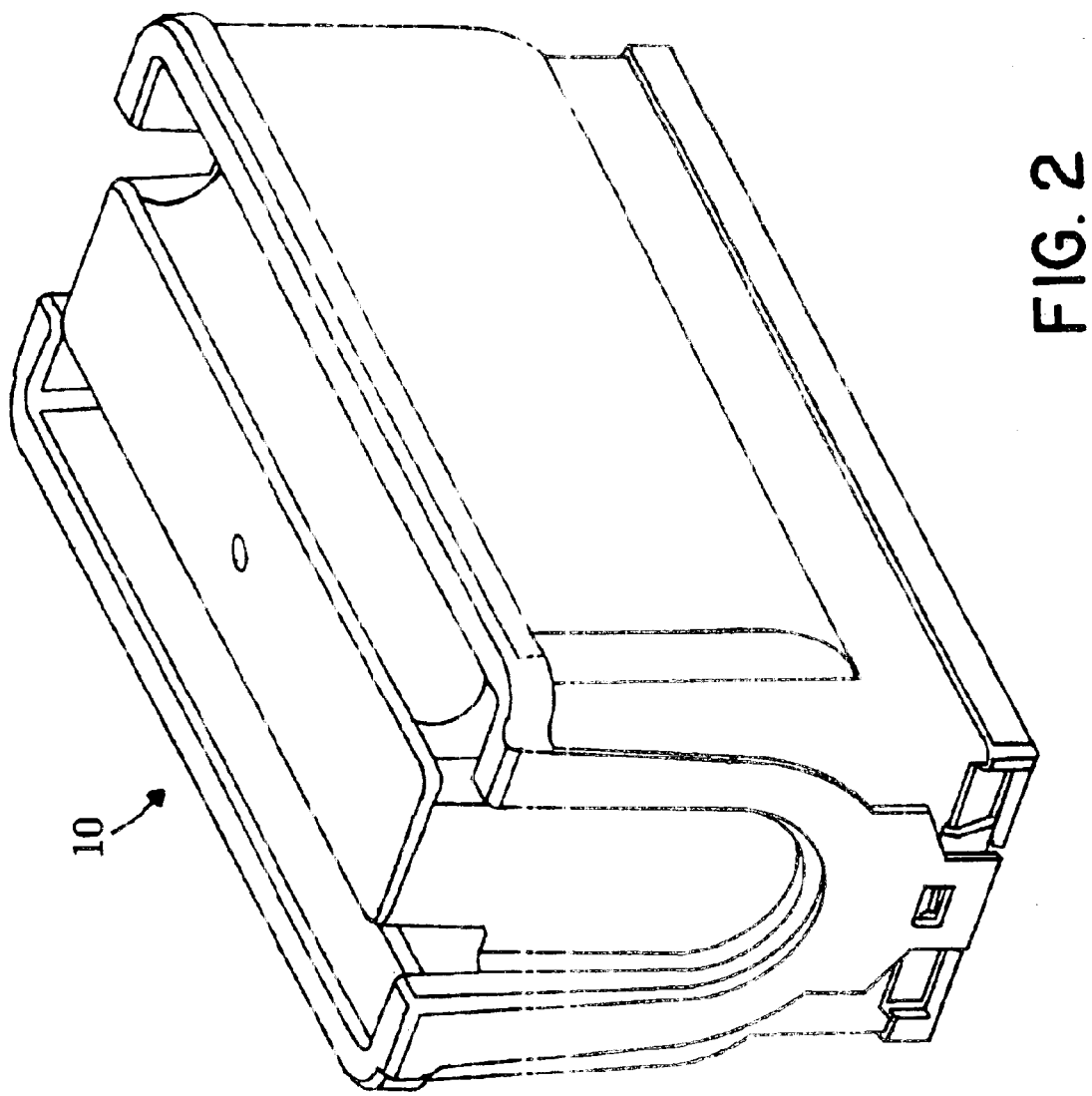
FIG. 2 is a perspective view of the disk carrier in FIG. 1.
Figure 3:
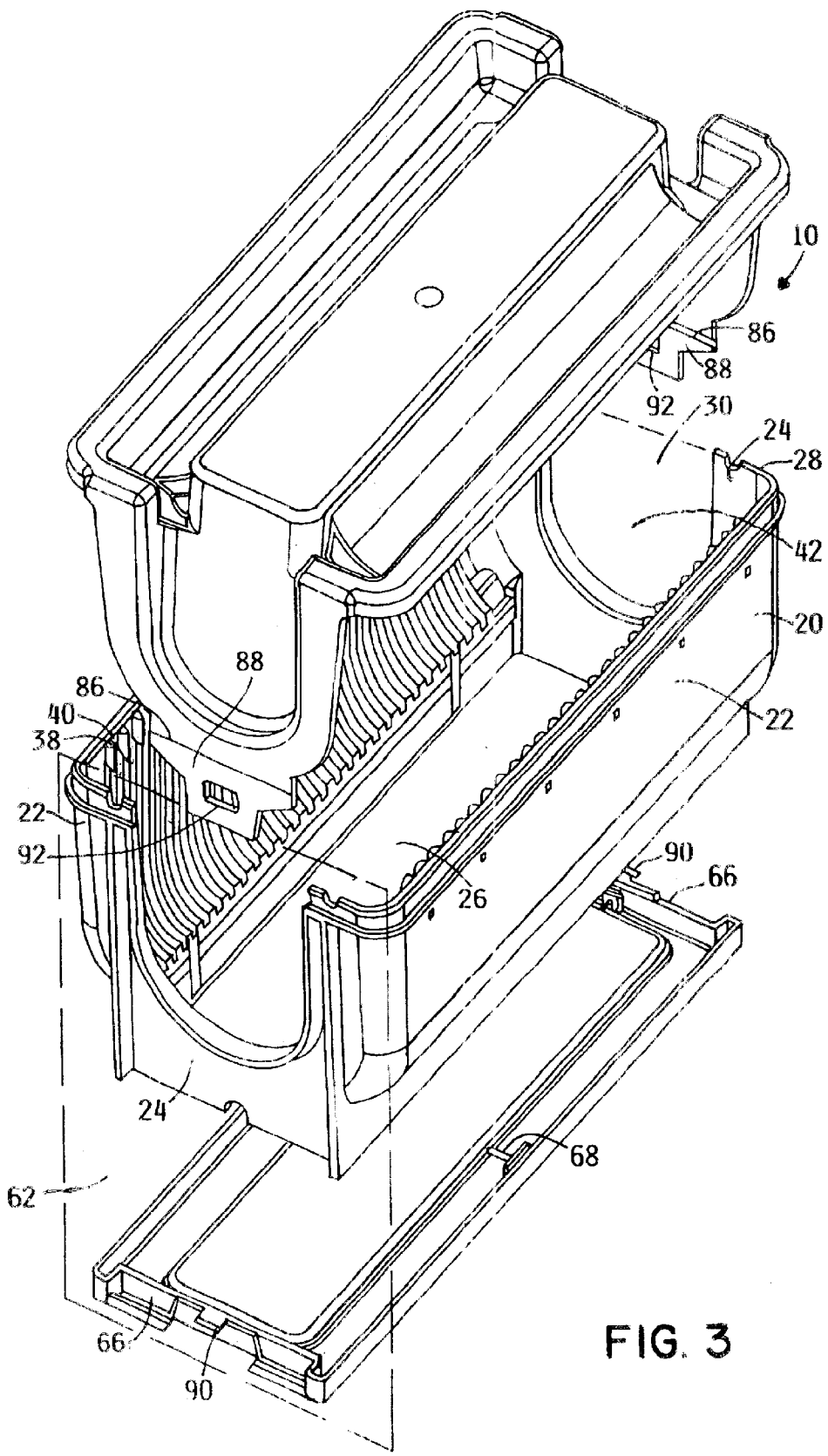
FIG. 3 is another exploded view of the disk carrier in FIG. 1.
Figure 4:
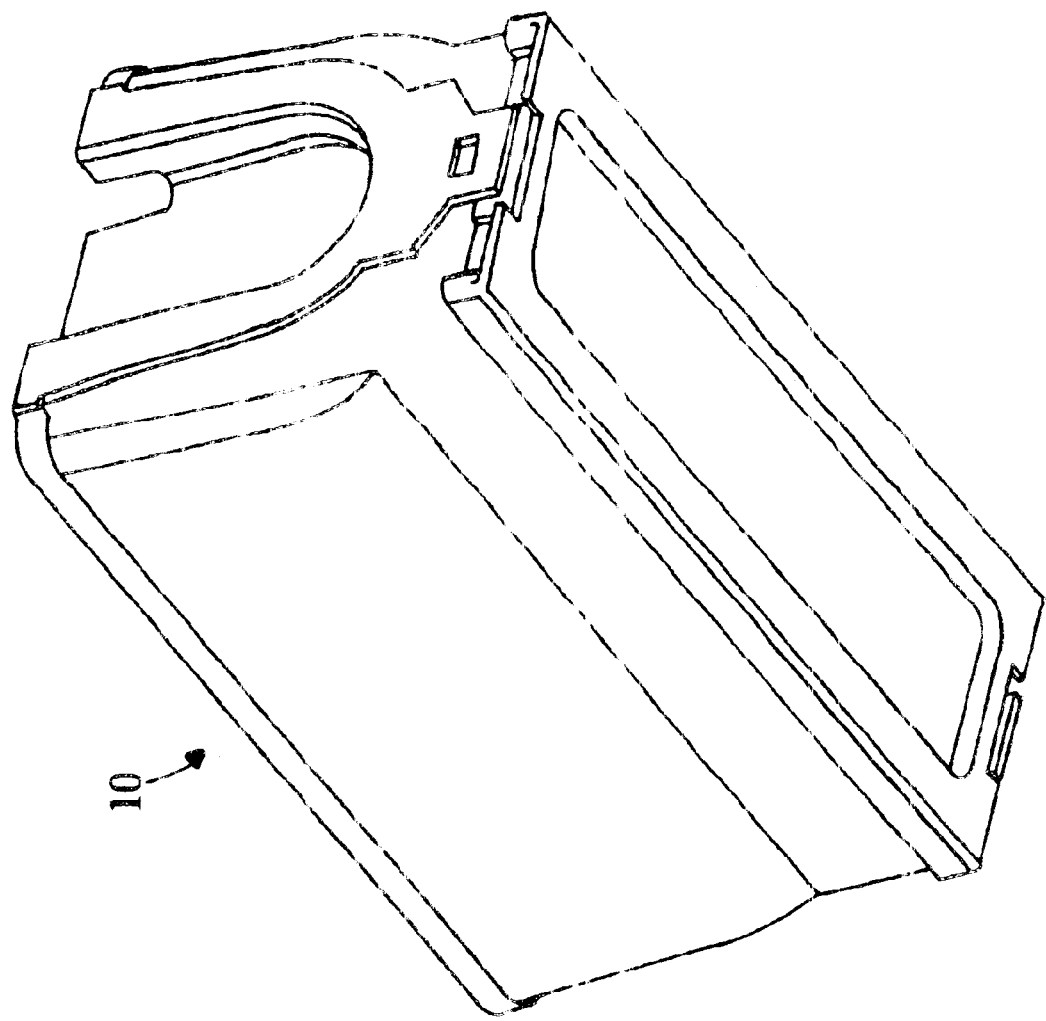
FIG. 4 is another perspective view of the disk carrier in FIG. 1.
Figure 5:
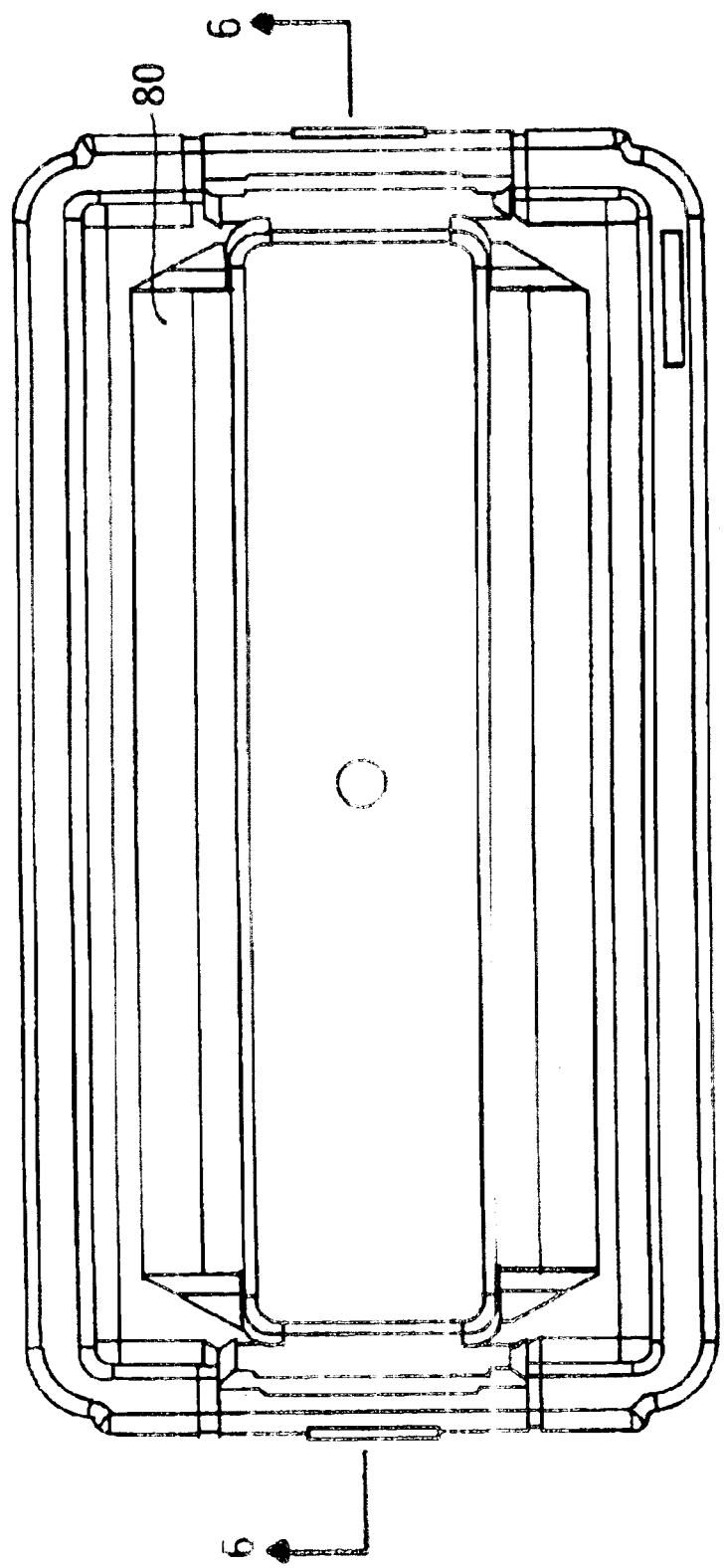
FIG. 5 is a top view of the disk carrier in FIG. 1.
Figure 6:
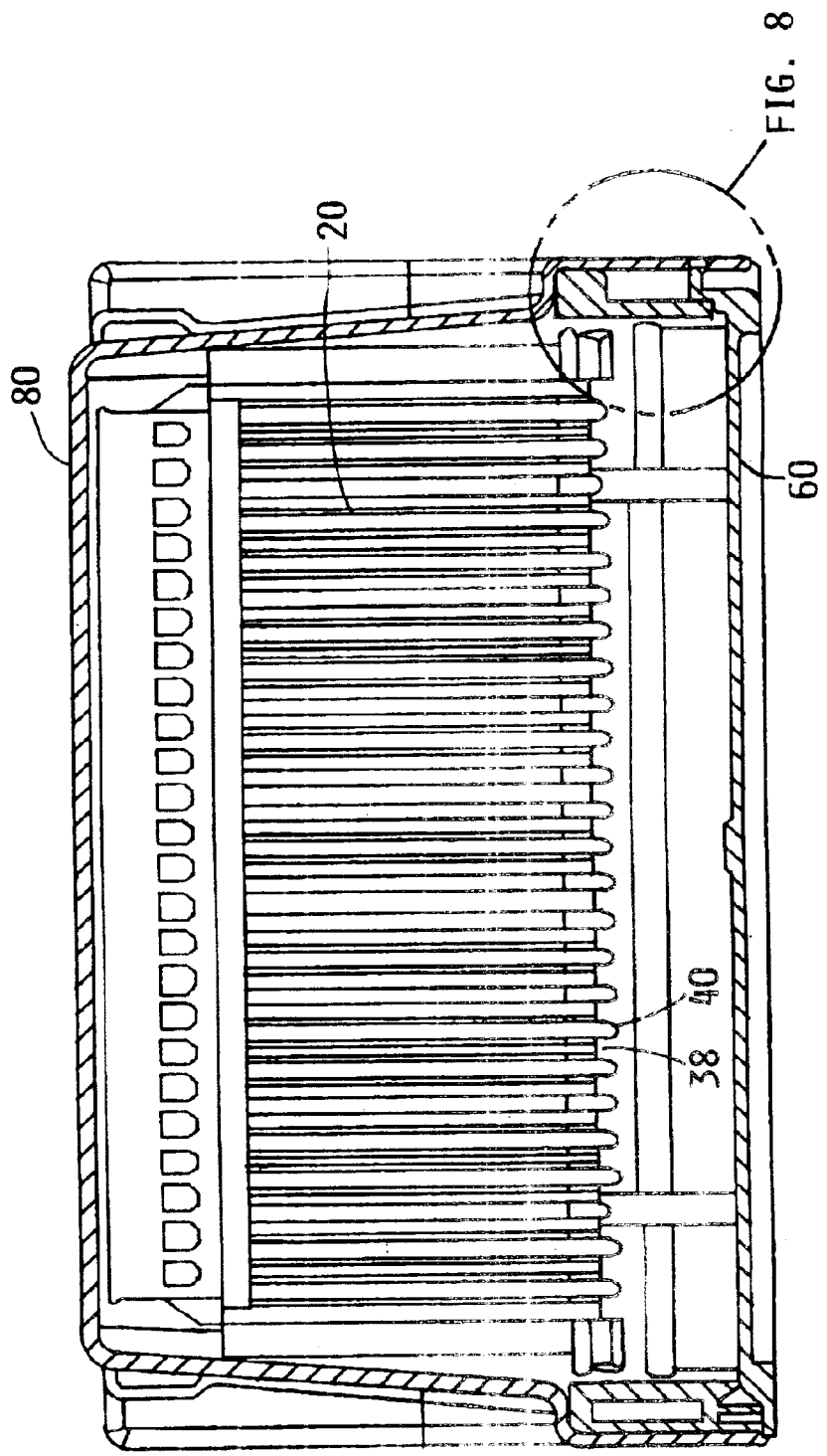
FIG. 6 is a cross-sectional view of the disk carrier at line 6—6 in FIG. 5.
Figure 7:
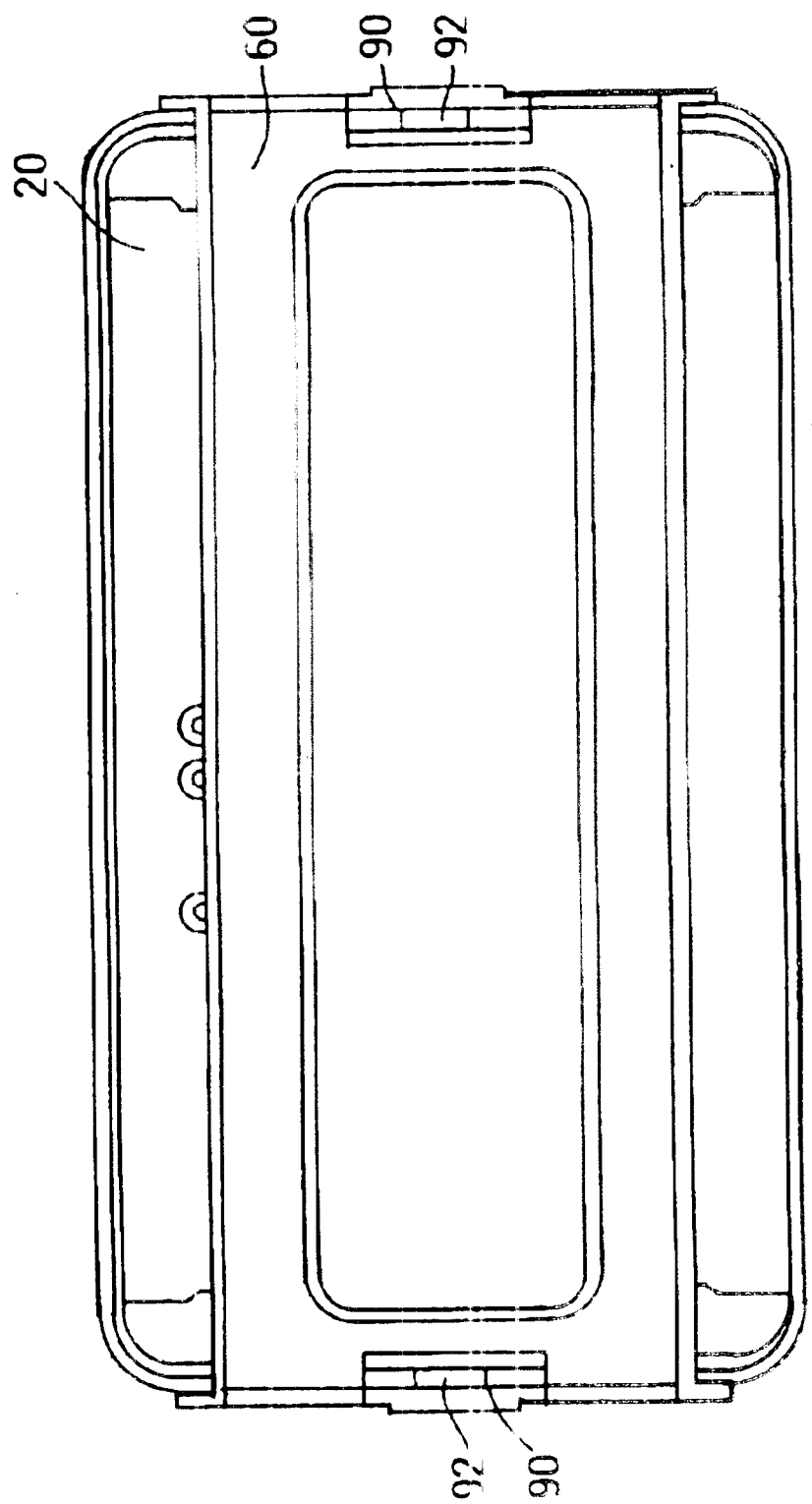
FIG. 7 is a bottom view of the disk carrier in FIG. 1.
Figure 8:
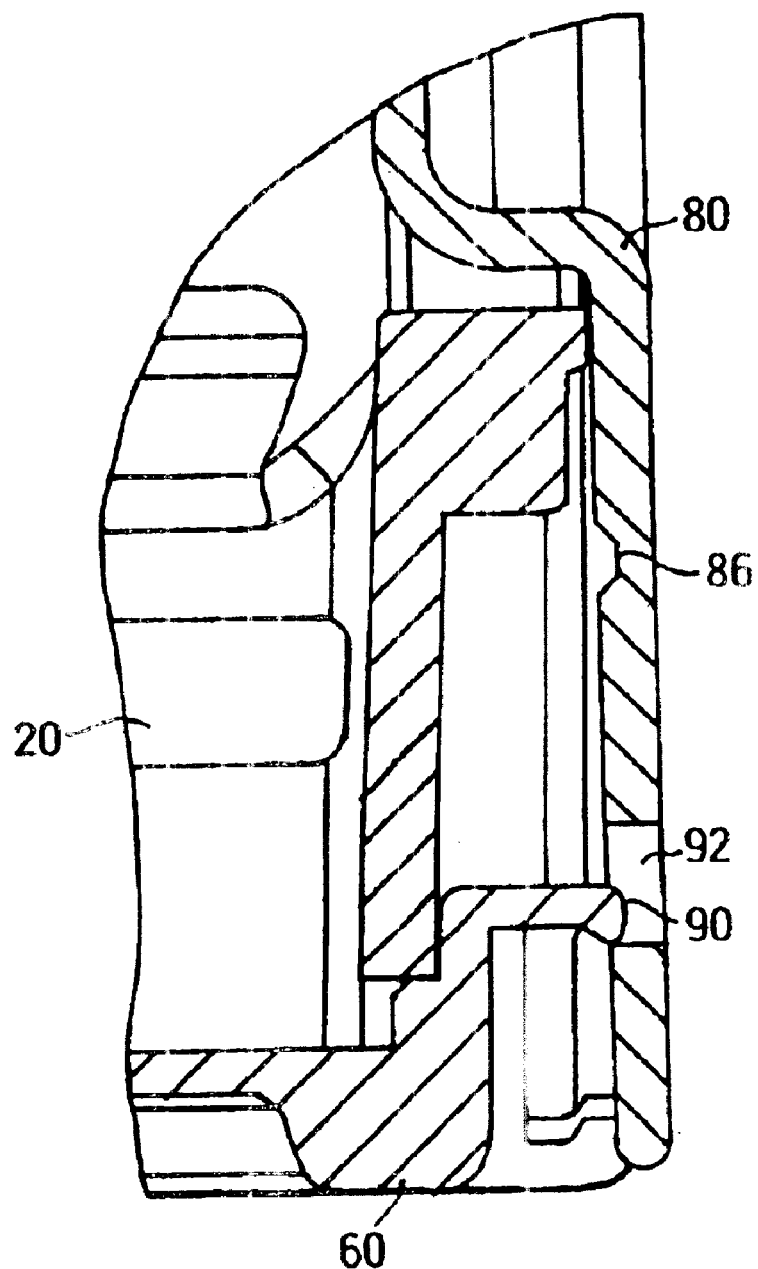
FIG. 8 is a magnified view of the corner demarcated in FIG. 6.

The preferred embodiment relates to a disk carrier in accordance with the present invention. As shown in FIGS. 1–7, a first embodiment of the disk carrier 10 comprises a disk cassette 20, a bottom cover 60, and a top cover 80. The disk cassette 20 has two opposing side walls 22 and two opposing end walls 24 forming an interior 26 to enclose and house a plurality of disks (not shown) therein, a top edge 28 defining a top opening 30, and a bottom edge 32 defining a bottom opening 36. The side walls 22 have a plurality of disk confining ribs 38 and a plurality of slot portions 40 to secure the disks in the interior 26 of the disk cassette. An industry standard is to house 25 disks. The end walls each have an ingress or U-shaped contoured top 42 to access the disks. The bottom cover 60 has two bottom cover ends 66 and is configured and arranged to align with and attach to the bottom edge 32 to cover the bottom opening 36. The bottom cover 60 may also have a living hinge 68. Together, the end walls 24 and the bottom cover ends 66 define a side connecting region 62.

The top cover 80 is configured and arranged to align with and attach to the top edge 28 and cover the top opening 30 and end wall ingresses 42. The top cover 80 has two opposing flaps 82, each joined along a flap upper edge 84 to a top cover main body 81, to conceal the two end wall ingresses 42, wherein each flap 82 has an articulation 86 defining a lower flap portion 88 so the lower flap portion 88 by itself may ride over a cooperating connection structure on the bottom cover 60 and smoothly return to its natural position to connect the flap 82 to the side connecting region 62. The articulations 86 may be positioned anywhere along the flaps 82 such as at the flap upper edges 84. Preferably, the articulations 86, which are thinned regions in the flaps, are positioned below the ingresses so that the interior of the disk cassette is covered before the flaps 82 are connected. The connection may occur on either the end walls 24, or preferably the bottom cover 60, or any combination or both of them. As those skilled in the art are aware, this connection may be made in numerous ways such as a catch, latch, or cooperating tab and slot. Preferably, the connection is made using a rounded tab or nub 90 on the bottom cover and a rectangular slot 92 on the flap. The lower flap portion 88 preferably has a small or slight camber (93). After many thermal cycles and cleanings, the lower flap portions may somewhat collapse. The small camber allows the flaps to still stay out far enough to get over the tabs and to position a tool such as a delidder between the flap and the bottom cover.

Figure 9:
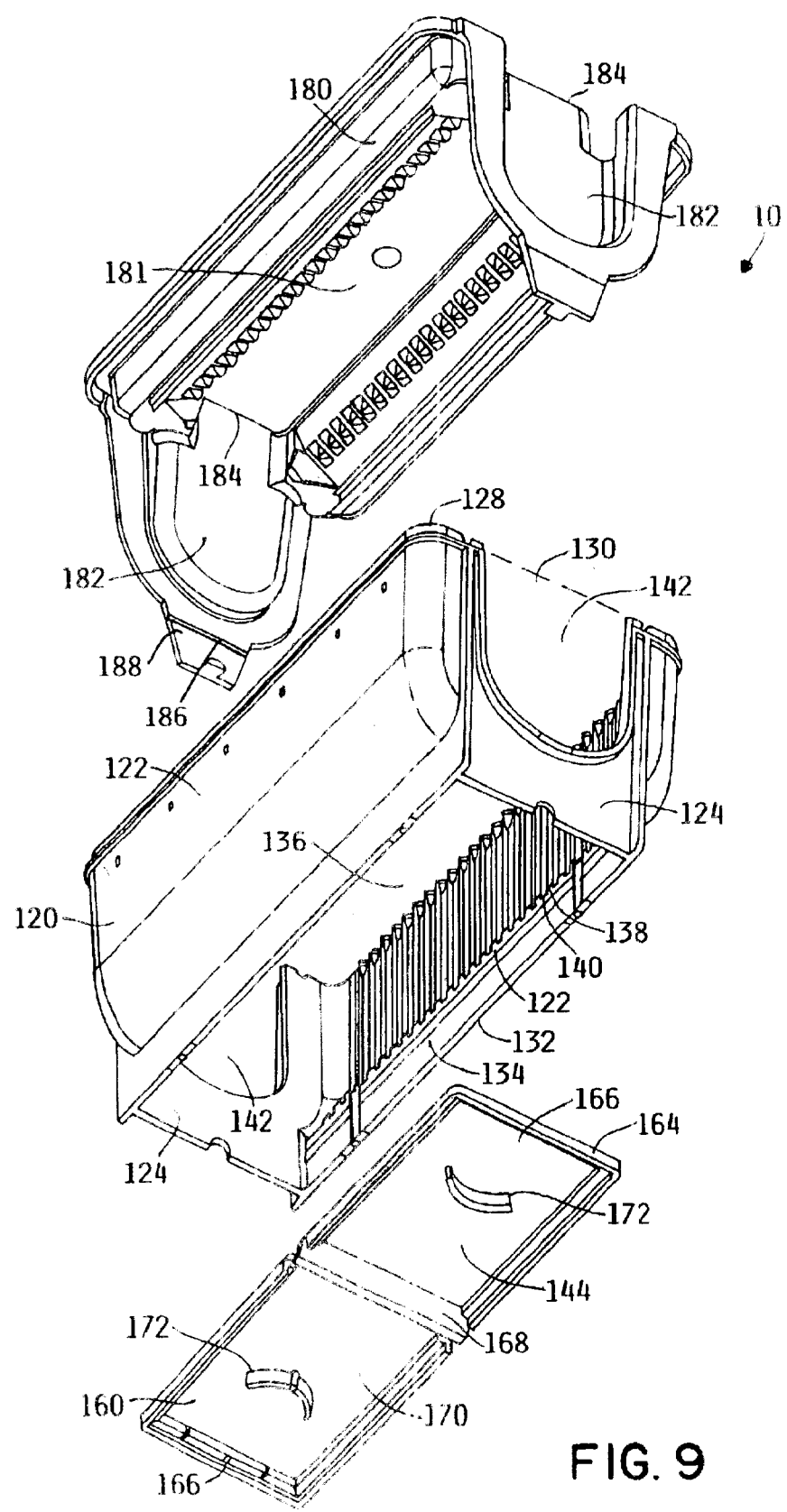
FIG. 9 is an exploded view of the second embodiment of a disk carrier in accordance with the present invention.
Figure 10:
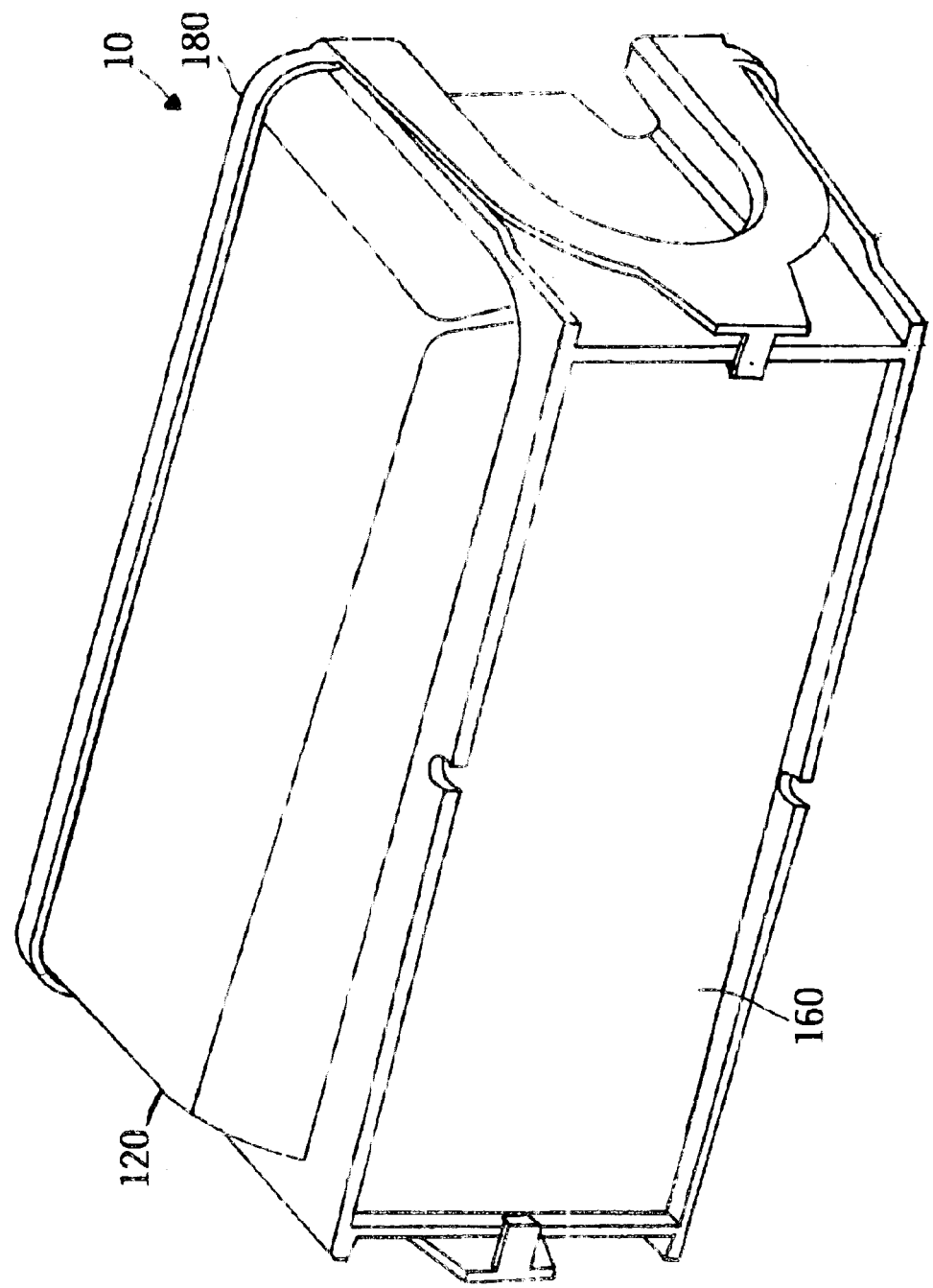
FIG. 10 is a perspective view of the disk carrier in FIG. 9 without the bottom cover.
Figure 11:
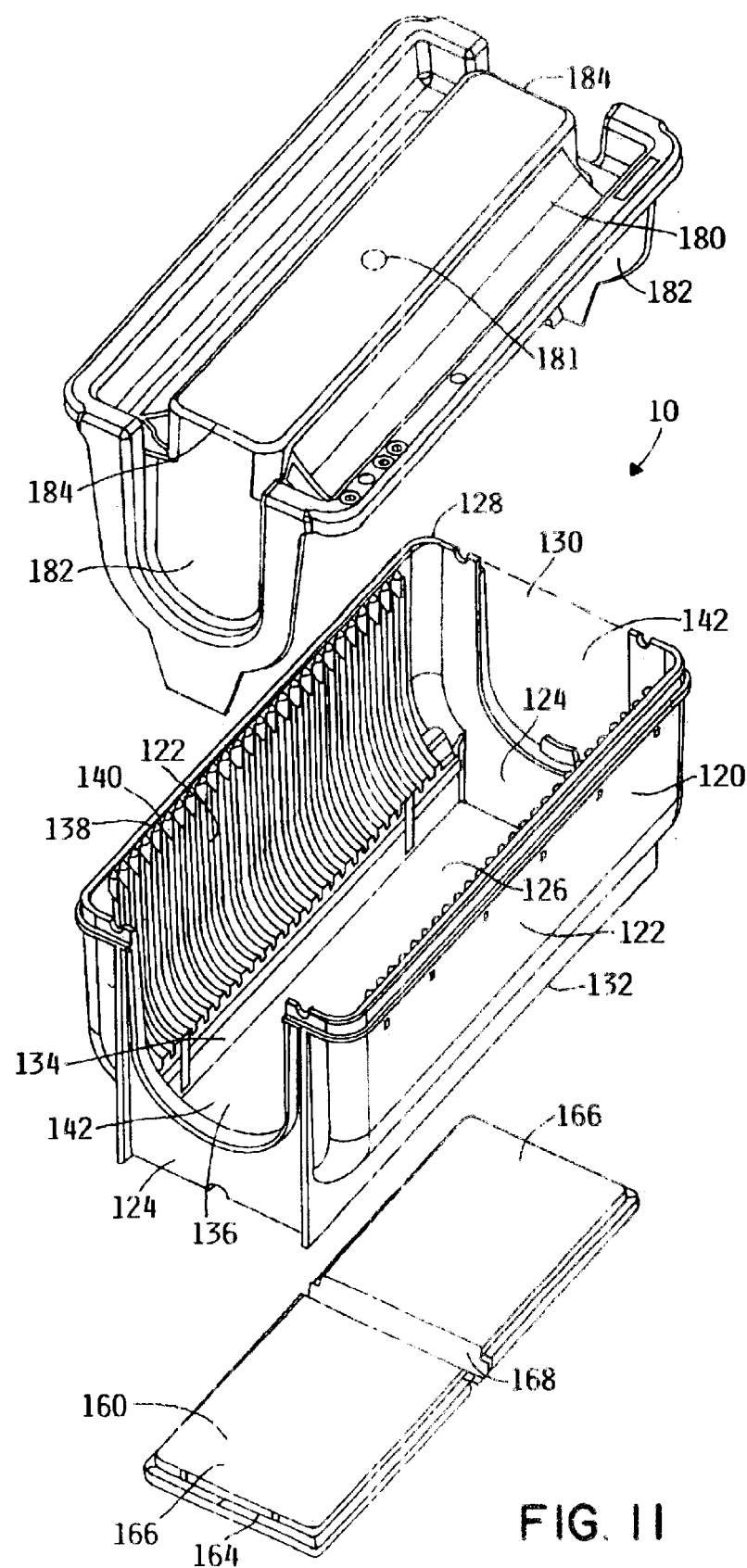
FIG. 11 is another exploded view of the disk carrier in FIG. 9.
Figure 12:
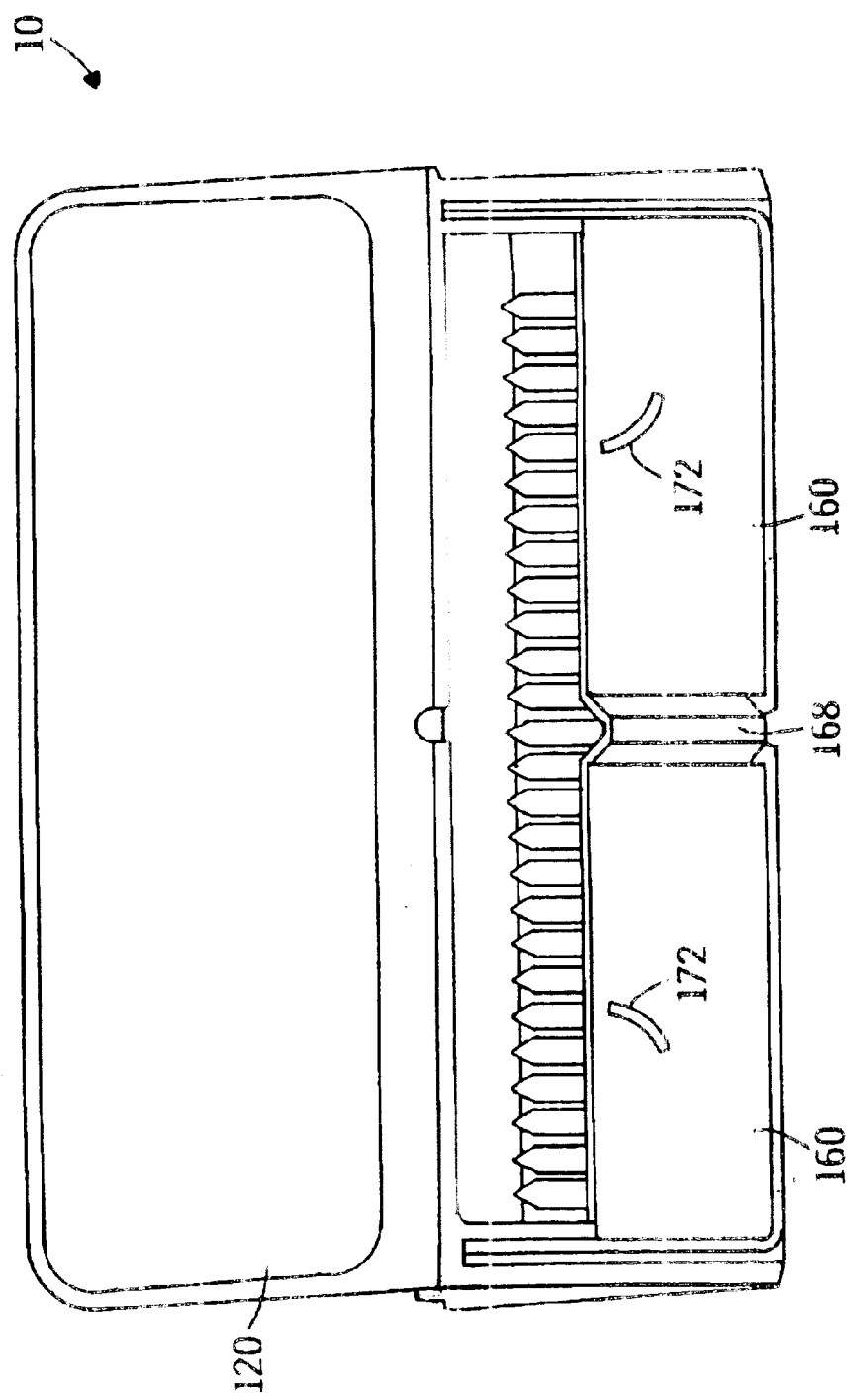
FIG. 12 is another perspective view of the disk carrier in FIG. 9 with the bottom partially cut away.
Figure 13:
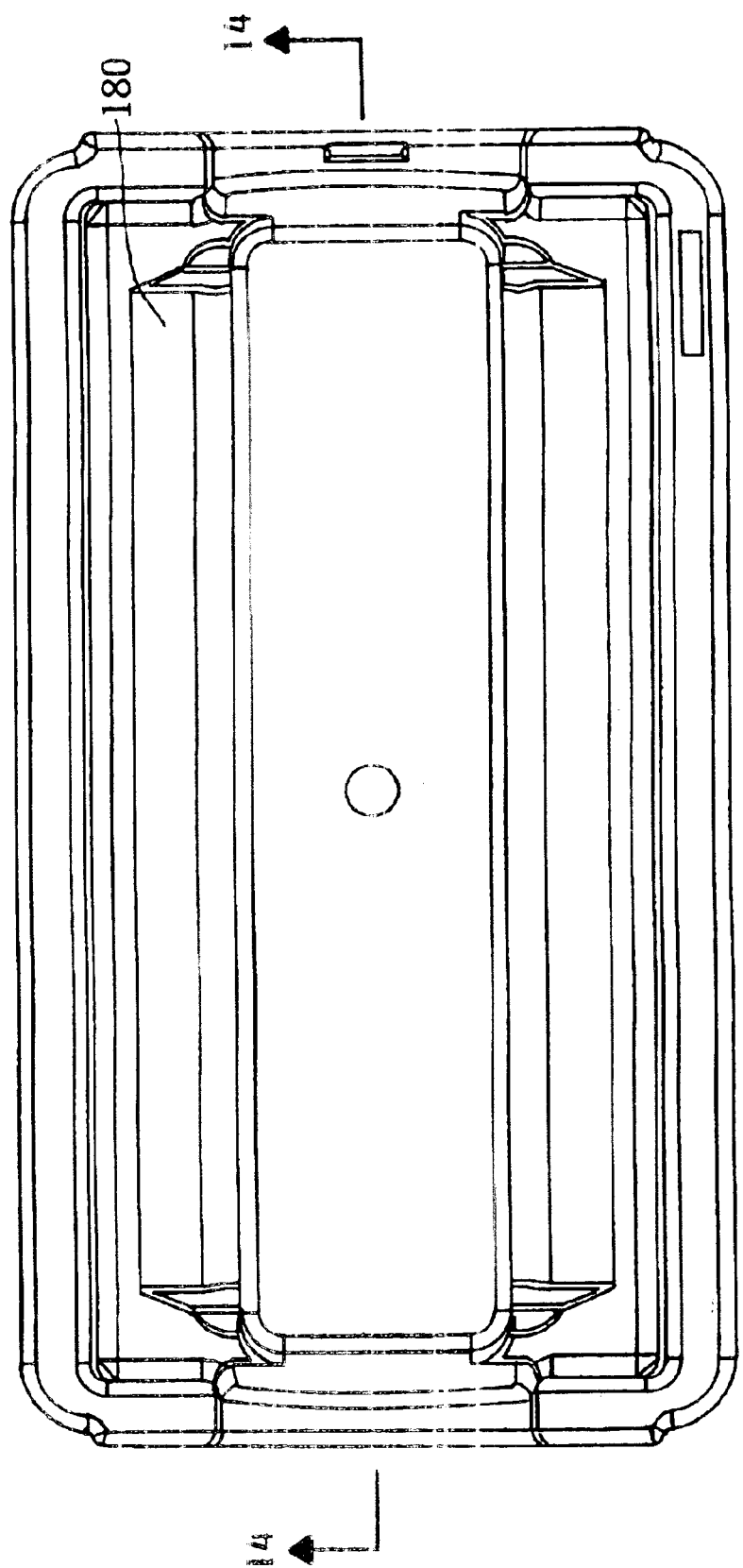
FIG. 13 is a top view of the disk carrier in FIG. 9.
Figure 14:
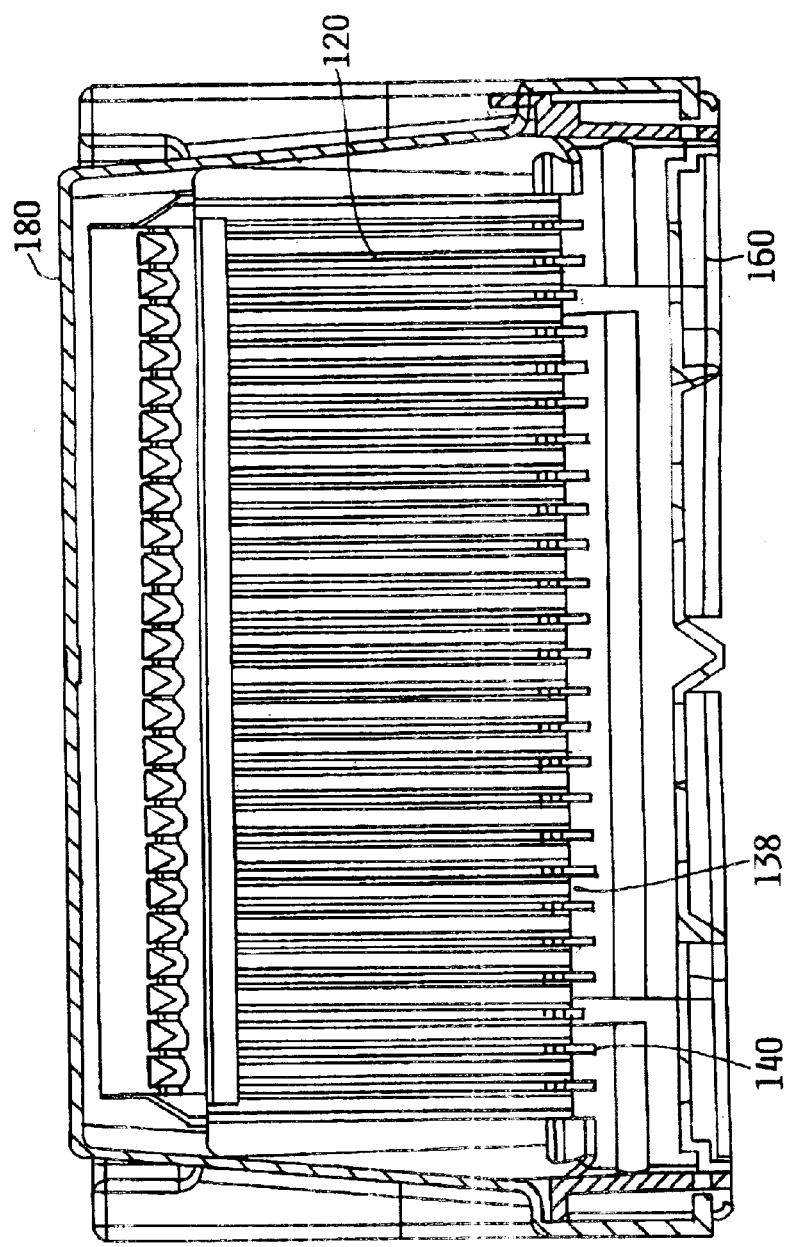
FIG. 14 is a cross sectional view of the disk carrier at line 14—14 in FIG. 13.
Figure 15:
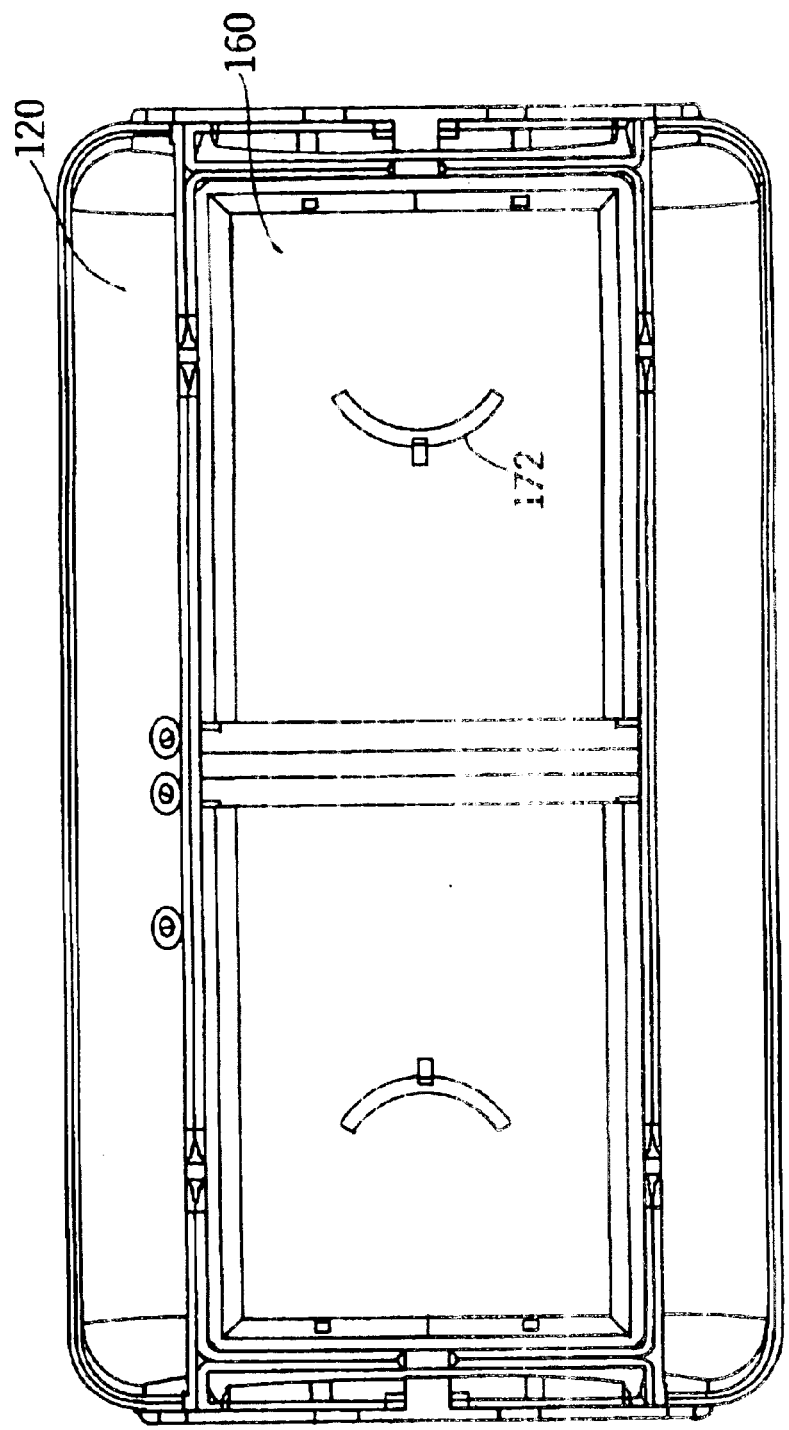
FIG. 15 is bottom view of the disk carrier in FIG. 9.

A second embodiment of the disk carrier 10, as shown in FIGS. 9–15, also comprises a disk cassette 120, a bottom cover 160, and a top cover 180. The disk cassette 120 has two opposing side walls 122 and two opposing end walls 124 forming an interior 126 to enclose and house a plurality of disks (not shown) therein, a top edge 128 defining a top opening 130, and a bottom edge 132 having an inner perimeter 134 and defining a bottom opening 136. The side walls 122 have a plurality of disk confining ribs 138 and a plurality of slot portions 140 to secure the disks in the interior 126 of the disk cassette 120. The end walls 124 each have an ingress or U-shaped contoured top 142 to access the disks. The bottom cover 160 has a bottom cover edge 164, two bottom cover ends 166, and a living hinge 168 between the bottom cover ends 166 to contract and expand the bottom cover 160. The bottom cover has finger grips 172 to perform this task manually, if necessary. The bottom cover 160 is configured and arranged to align against the inner perimeter 134 to cover the bottom opening 136. The top cover 180 is configured and arranged to align with and attach to the top edge 128 and cover the top opening 130 and the two end wall ingresses 142. The top cover 180 has two flaps 182 to conceal the end wall ingresses, which flaps 182 extend to the bottom cover 160 to connect therewith. These flaps 182 may have articulations 186 defining a lower flap portion 188 that by itself may be moved outwardly.

The disk carrier 10 of the preferred embodiment has a bottom surface 44, 144 upon which the entire device rests. This bottom surface may include the bottom edge 32, 132 of the disk cassette 20, 120, a bottom cover surface 70, 170 of the bottom cover 60, 160, part of the flaps 82, 182 of the top cover 80, 180, or a combination of these for the respective embodiment. Preferably, the first embodiment bottom surface is comprised of the bottom cover surface 70 of the bottom cover 60, since this configuration most resembles the configuration of presently used disk carriers and is expected to require the least amount of manufacturing process retooling. Alternatively, the bottom cover surface 70 might be flush with the bottom edge 32 of the disk cassette 20, so that both the bottom cover surface 70 and bottom edge 32 comprise the bottom surface 44 of the disk carrier 10.

The disk carrier 10, the bottom cover, and the top cover are each made of a molded polymer. The molded polymer may be selected from polycarbonate, polypropylene, polyester, or any combination of these or other similar materials known to those skilled in the art. By an appropriate choice of materials, the disk carrier 10 is static dissipative between the disks and the bottom surface. Alternatively, electrically conductive strips (not shown) connect the disks and the bottom surface through the disk cassette and bottom cover. These strips can be molded into the disk cassette or covers and need not touch the disks to make an electrical connection between them and the bottom surface of the disk carrier. Using either a conductive material or preferably conductive strips, or a combination thereof, the disk carrier 10 can be grounded by setting it on a grounded surface.

In operation, the first embodiment is used by providing a disk carrier including a disk cassette having two side walls and two end walls forming an interior, an open top, an open bottom, and a U-shaped contoured top on each end wall; a top cover including two flaps, each having an articulation defining a lower flap portion; a bottom cover having two bottom cover ends with a tab on each end; and at least one disk. The at least one disk is inserted into the disk cassette and the bottom cover is attached to the disk cassette. The top cover is attached to the disk cassette, causing the lower flap portions to ride over the tabs on the bottom cover to at least partially connect each flap to the bottom cover. The flap is then pushed inwardly to secure the connection. Those skilled in the art are aware that these steps may be performed as effectively in other orders as well.

In operation, the second embodiment is used by providing a disk carrier including a disk cassette having two side walls and two end walls forming an interior, an open top, an open bottom, and a U-shaped contoured top on each end wall; a top cover including two flaps; a bottom cover having two bottom cover ends and a living hinge between the bottom cover ends to contract and expand the bottom cover; and at least one disk. The at least one disk is inserted into the disk cassette and the top cover is attached to the disk cassette. The bottom cover is contracted and inserted into the bottom opening and then expanded to connect the bottom cover and the top cover. Those skilled in the art are aware that these steps may be performed as effectively in other orders as well.

Although the preferred embodiment of the disk carrier has been described herein, numerous changes and variations can be made and the scope of the invention is intended to be defined by the claims herein. For example, depending on the configuration of the ingresses, the structures of the top cover and the bottom cover may be reversed.

That which is claimed:

1. A disk carrier for housing a plurality of disks, comprising;

a disk cassette having at least two opposing side walls and at least two opposing end walls forming an interior to enclose the disks, a top edge defining a top opening, and a bottom edge defining a bottom opening, wherein the side walls have a plurality of disk confining ribs and a plurality of slot portions to secure the disks in the interior of the disk cassette, and wherein the end walls have at least one ingress to access the disks;

a bottom cover to cover the bottom opening, the bottom cover having at least two bottom cover ends and being configured and arranged to attach to the bottom edge of the disk cassette, the bottom cover ends and the disk cassette end walls defining a side connecting region having a cooperating connection structure; and a top cover to cover the top opening and the at least one end wall ingress, the top cover configured and arranged to attach to the top edge and having at least one flap to conceal the at least one end wall ingress, wherein each flap has an articulation defining a lower flap portion so the lower flap portion by itself rides outwardly over the cooperating connection structure and smoothly returns to its natural position, the flap bending at the articulation, to connect the flap to the side connecting region.

2. The disk carrier of claim 1, wherein each flap connects to the bottom cover.

3. The disk carrier of claim 1, wherein the articulation is created by a thinned region in each flap.

4. The disk carrier of claim 1, wherein a tab and slot are used as the cooperating connection structure, and wherein the tab is positioned on the side connection region.

5. The disk carrier of claim 1, wherein when the top cover is attached to the disk cassette, the articulation is positioned below the at least one ingress.

6. The disk carrier of claim 1, wherein the at least one flap has a flap upper edge and the articulation is positioned on the flap upper edge.

7. The disk carrier of claim 1, wherein the lower flap portion is slightly cambered.

8. The disk carrier of claim 1, wherein the bottom cover has a bottom cover surface that is flush with the bottom edge of the disk carrier when the bottom cover is attached to the disk cassette.

9. The disk carrier of claim 1, wherein the disk cassette, top cover, and bottom cover, are each made of a molded polymer.

10. The disk carrier of claim 9, wherein the molded polymer is comprised of at least one of the polymers from the group of polymers consisting of polycarbonate, polypropylene, and polyester.

11. The disk carrier of claim 1, wherein the disk carrier has a bottom surface and has an electrically conductive material between the disks and the bottom surface.

12. The disk carrier of claim 1, wherein the disk carrier has a bottom surface and electrically conductive strips connect the disks to the bottom surface.

13. The disk carrier of claim 1, wherein the bottom cover has a living hinge.

14. A disk carrier for housing a plurality of disks, comprising;
a disk cassette having at least two opposing side walls and at least two opposing end walls forming an interior to enclose the disks, a top edge defining a top opening, and a bottom edge having an inner perimeter and defining a bottom opening, wherein the side walls have a plurality of disk confining ribs and a plurality of slot portions to secure the disks in the interior of the disk cassette, and wherein the end walls have at least one downwardly extending U-shaped opening to access the disks;
a bottom cover to cover the bottom opening, the bottom cover having a bottom cover edge, at least two bottom cover ends, and a living hinge between the bottom cover ends to contract and expand the bottom cover, wherein the bottom cover edge is configured and arranged to align against the inner perimeter of the bottom edge; and
a top cover to cover the top opening and the U-shaped opening, the top cover configured and arranged to attach to the top edge of the disk cassette and having at least one flap to conceal the at least one end wall U-shaped opening, wherein each flap extends to the bottom cover to connect therewith.

15. The disk carrier of claim 14, wherein a cooperating tab and slot are used to connect the at least one flap to the bottom cover.

16. The disk carrier of claim 14, wherein the bottom cover has a bottom cover surface that is flush with the bottom edge of the disk carrier when the bottom cover is attached to the disk cassette.

17. The disk carrier of claim 14, wherein the disk cassette, top cover, and bottom cover, are each made of a molded polymer.

18. The disk carrier of claim 17, wherein the molded polymer is comprised of at least one of the polymers from the group of polymers consisting of polycarbonate, polypropylene, and polyester.

19. The disk carrier of claim 14, wherein the disk carrier has a bottom surface and is made of electrically conductive material between the disks and the bottom surface.

20. The disk carrier of claim 14, wherein the disk carrier has a bottom surface and electrically conductive strips connect the disks to the bottom surface.

21. The disk carrier of claim 14, wherein the at least one top cover flap has an articulation defining a lower flap portion so the lower flap portion by itself may be moved outwardly.

22. A method of using a disk carrier for housing a plurality of disks, comprising:
a) providing a disk carrier including a disk cassette having an open top, an open bottom, and at least one end wall ingress; a top cover including at least one flap having an articulation defining a lower flap portion; and a bottom cover having a cooperating connection structure;
b) providing at least one disk;
c) inserting the at least one disk in the disk cassette;
d) attaching the bottom cover to the disk cassette;
e) attaching the top cover to the disk cassette, causing the lower flap portion to ride over the bottom cover cooperating connection structure to at least partially connect the flap to the bottom cover; and
f) pushing the flap inwardly to secure the connection.

23. A method of using a disk carrier for housing a plurality of disks, comprising:
a) providing a disk carrier including a disk cassette having an open top, an open bottom, and at least one end wall ingress; a bottom cover having at least two bottom cover ends and a living hinge between the bottom cover ends to contract and expand the bottom cover; and a top cover including at least one flap extending to the bottom cover to connect therewith;
b) providing at least one disk;
c) inserting the at least one disk in the disk cassette;
d) attaching the top cover to the disk cassette;
e) contracting the bottom cover;
f) at least partially inserting the bottom cover into the bottom opening; and
g) expanding the bottom cover to connect the bottom cover and the top cover.

* * * * *